(12) United States Patent
Chang et al.

(10) Patent No.: US 6,441,403 B1
(45) Date of Patent: Aug. 27, 2002

(54) SEMICONDUCTOR DEVICE WITH ROUGHENED SURFACE INCREASING EXTERNAL QUANTUM EFFICIENCY

(75) Inventors: Chih-Sung Chang; Tzong-Liang Tsai; Chung-Ying Chang, all of Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 09/688,605

(22) Filed: Oct. 14, 2000

(30) Foreign Application Priority Data

Jun. 23, 2000 (TW) .......................................... 089112428

(51) Int. Cl.[7] .............................................. H01L 33/00
(52) U.S. Cl. ............................ 257/94; 257/97; 257/98; 257/103
(58) Field of Search ............................ 257/94, 96, 97, 257/98, 103

(56) References Cited

U.S. PATENT DOCUMENTS

| | | | |
|---|---|---|---|
| 5,040,044 A | | 8/1991 | Noguchi et al. |
| 5,429,954 A | | 7/1995 | Gerner |
| 5,693,963 A | * | 12/1997 | Fujimoto et al. .............. 257/94 |
| 5,792,698 A | * | 8/1998 | Nishitani ..................... 438/287 |
| 5,898,191 A | | 4/1999 | Kwon et al. |
| 6,051,847 A | * | 4/2000 | Oku et al. ..................... 257/94 |
| 6,091,085 A | * | 7/2000 | Lester .......................... 257/98 |
| 6,265,236 B1 | * | 7/2001 | Gerner ......................... 438/22 |
| 6,277,665 B1 | * | 8/2001 | Ma et al. ....................... 438/46 |
| 6,339,014 B1 | * | 1/2002 | Ishida et al. ................. 438/503 |

OTHER PUBLICATIONS

Schnitzer, I. and Yablonovitch, E., "30% external quantum efficiency . . . " Appl. Phys. Lett. 63 (16) Oct. 18, 1993, pp. 2174–76.*

* cited by examiner

*Primary Examiner*—Sara Crane
(74) *Attorney, Agent, or Firm*—Birch, Stewart, Kolasch & Birch, LLP

(57) ABSTRACT

The present invention provides a semiconductor device with a roughened surface that increases external quantum efficiency thereof. Roughening of the semiconductor device surface is done by epitaxial growth techniques that may include hydride vapor phase epitaxy (HVPE) technique, organometallic vapor phase epitaxy (OMVPE) technique, or molecular beam epitaxy (MBE) technique.

24 Claims, 10 Drawing Sheets

SEMICONDUCTOR DEVICE WITH ROUGHENED SURFACE INCREASING EXTERNAL QUANTUM EFFICIENCY

FIELD OF THE INVENTION

The present invention provides a semiconductor device, and more particularly, relates to a light emitting device with roughened surface that increases external quantum efficiency of the device.

BACKGROUND OF THE INVENTION

For a light emitting device that uses solid-state materials, the light emitting efficiency is determined by the internal together with external quantum efficiency. Generally, the internal quantum efficiency highly relates to materials per se and the epitaxy quality; and the external quantum efficiency highly relates to refractive index of the materials and surface flatness. The refractive index of AlInGaN series materials is about between 2.2 and 2.9. The external quantum efficiency of an AlInGaN series light emitting chip without surface treatment is about 10% to 20%. The overall light emitting output will be significantly improved if the external quantum efficiency is enhanced.

So far, the surface roughening operation according to prior art is performed after the stage of epitaxy growth. For example, in U.S. Pat. No. 5,040,044, a surface of an LED device is roughened by the chemical etching to reduce overall reflection and to increase light output. Other related prior arts include U.S. Pat. Nos. 5,898,191 and 5,429,954. However, the above prior art process treatment is not suitable for GaN series materials since they are rigid and corrosion-resistant over acids and bases. Ordinary chemical agents and organic solvents are hard to etch the GaN series materials. A reactive ion etching (RIE) method that is mostly applied to etch GaN will deteriorate the quality of epitaxial layers. Particularly, the p-type GaN epitaxial layers are susceptible to increase in resistance and becomes an insulator.

SUMMARY OF THE INVENTION

In consideration of the above recitations, the present invention provides a AlGaInN series light emitting device with high output luminance by directly growing a rough surface using epitaxial technology.

Comparing to light emitting devices that do not apply the techniques of the present invention, the luminance of light emitting devices of the present invention significantly increases.

In order to further depict the ways, structures and features of the present invention, the following drawings in conjunction in details of invention describing the embodiments of the present invention are provided.

DETAILED DESCRIPTION OF THE INVENTION

The present invention provides an effective method producing an LED device with roughen surface. Comparing to prior art technology, the present invention enhances device efficacy and does not need extra back-end treatment process. Production costs are significantly reduced and throughput is increased as well.

Firstly, a hydride vapor phase epitaxy (HVPE) process, an organometallic vapor phase epitaxy (OMVPE) process, or a molecular beam epitaxy (MBE) process is applied to form a compound semiconductor layer on a substrate. For III–V groups of semiconductor materials, the compound semiconductor layer is an $Al_xGa_yIn_{1-x-y}N$ layer, wherein $0 \leq x \leq 1$, $0 \leq y \leq 1$, and $0 \leq x+y \leq 1$; gallium source is TMGa or TEGa; aluminum source is TMAl or TEAl; indium source is TMIn or TEIn; nitrogen source is $NH_3$ or $(CH_3)_2N-NH_2$ (dimethylhydrazine). The p-type dopant employed in the process is Zn, Cd, Be, Mg, Ca or Ba. The carrier is hydrogen, nitrogen, or a combination of hydrogen and nitrogen.

Figure 1A:
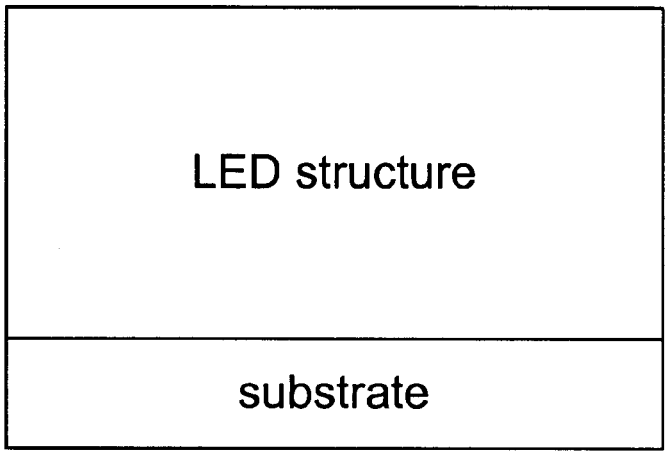
FIG. 1(A) is a schematic diagram of a side view of GaN epitaxy without surface-roughening treatment.
Figure 1B:
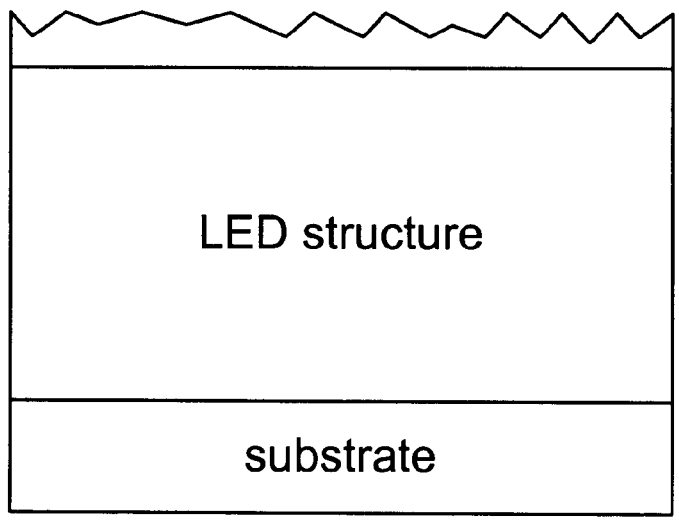
FIG. 1(B) is a schematic diagram of a side view of GaN epitaxy with surface-roughening treatment.

The present invention mainly applies epitaxial growth methods to directly grow a rough surface. In our study, varying the V/III ratio, carrier, temperature, pressure and growth rate allows one to grow rough epitaxial layer. FIG. 1(A) shows a side view of GaN epitaxy without surface-roughening treatment. FIG. 1(B) shows a side view of GaN epitaxy with surface-roughening treatment. The rough surface contains uniformly distributed irregular holes. The average diameter of the holes is about 0.1 to 2 $\mu$m and the average depth is about 0.1 to 2 $\mu$m.

If the OMVPE method is applied, in general, growth process of GaN series materials in hydrogen environment is significantly different from that in nitrogen environment. By varying the V/III ratio and contents of nitrogen and hydrogen in the carrier, roughness of the epitaxy surface can be controlled. The mobility of atoms over the chip surface varies at different temperatures. Generally, epitaxial growth at a relatively low temperature results in insufficiency of the atomic mobility of chip surface. Growth rate is usually tuned to a low level for the sake of good epitaxy quality and better surface flatness. In our study, the object of roughening surface can be achieved by controlling the growth temperature and rate.

Generally speaking, if OMVPE method is applied to grow GaN series materials and ammonia gas is use as the nitrogen source, the growth temperature of epitaxial layer, except the light emitting active layer which contains indium element and therefore should be grown at a relatively low temperature, is about 1000° C. to 1200° C. in consideration of material rigidity and dissociation rate of the ammonia gas. The present invention discloses a p-type or n-type GaN layer, which is grown at a temperature lower than 1000° C., as the electrode contact layer. That is, the low atomic mobility on the chip surface is utilized to produce a rough surface.

EXAMPLE 1

Figure 3A:
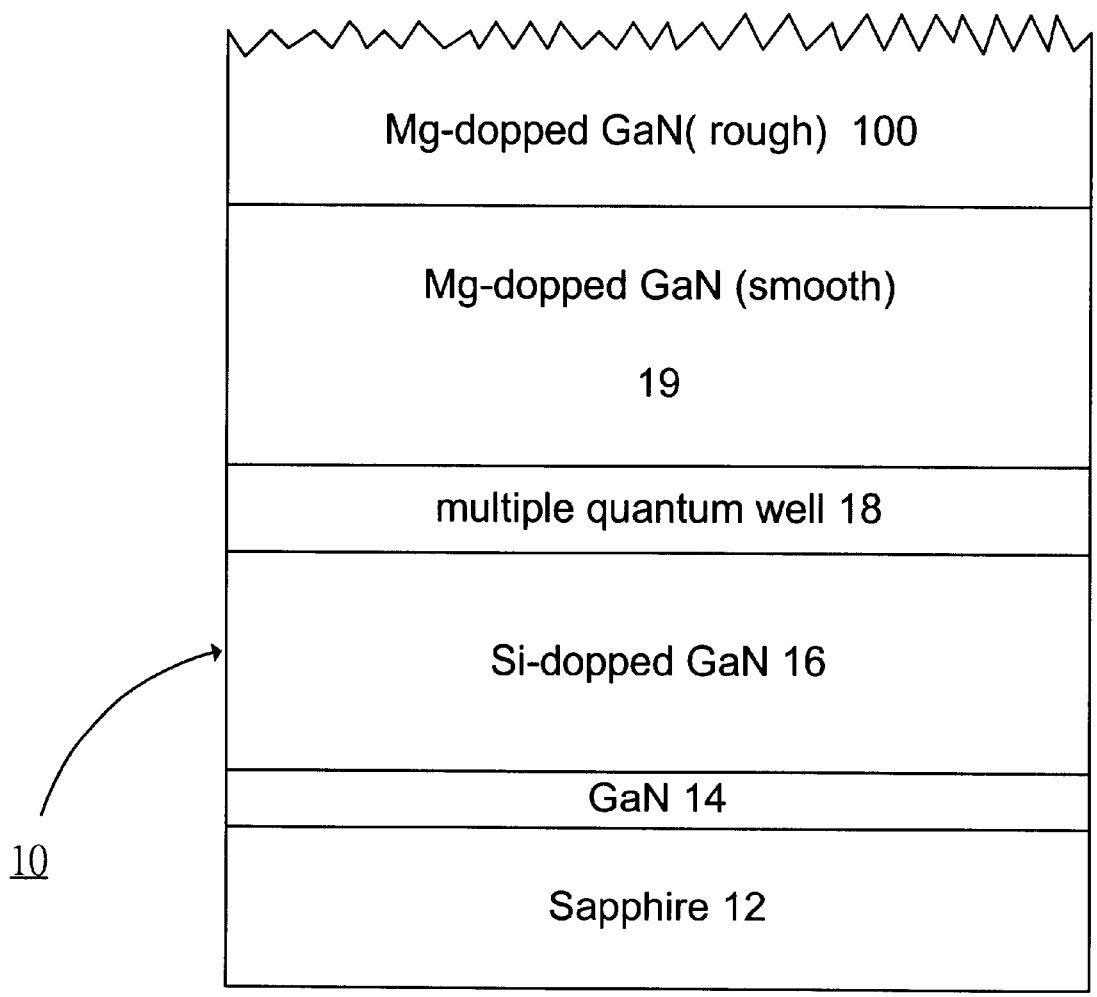
FIGS. 3(A) and 3(B) are schematic diagrams of a light emitting diode of the present invention.

Please refer to FIG. 3(A) that is a schematic diagram of a light emitting diode epi-wafer 10 of the present invention. An epitaxy-ready sapphire substrate 12 is loaded in an organometallic vapor phase epitaxy growth reactor (not shown in the figure) initially. The single crystal substrate 12 is composed of aluminum oxide, silicon carbide or GaAs. Firstly, the sapphire substrate 12 is preheated for 10 minutes at a temperature of 1150° C. Then the temperature of the sapphire substrate 12 is reduced to between about 500° C. and 600° C. When the temperature of the sapphire substrate 12 reaches at 520° C., a GaN buffer layer 14 of a thickness of 25 nm is grown on the surface of the substrate 12. Next, the temperature of the sapphire substrate 12 is increased to 1100° C. and a Si-doped (n-type silicon doped) GaN layer 16 of a thickness of about 4 µm is grown at a rate of about 2 µm/hr on the buffer layer 14. Next, the sapphire substrate 12 is cooled to about 820° C. and immediately an InGaN/GaN multiple quantum well structure or double-hetero structure 18 is grown on the surface of the n-type Si-doped GaN layer 16. The multiple quantum well or double-hetero structure 18 served as a light emitting active layer. Then the temperature is increased to 1100° C. and a p-type Mg-doped GaN smooth layer 19 is grown on the surface of the InGaN/GaN multiple quantum well structure 18. Lastly, growth parameters are changed to allow the formation of a rough p-type Mg-doped GaN layer 100 at a relatively low temperature. The light emitting diode epi-wafer 10 is thus produced. In a preferred embodiment, the rough p-type layer 100 is grown at a growth rate between 10 Å/min and 1000 Å/min, and V/III ratio thereof is between 1000 and 500000. The n-type dopant is Si, Ge or Tn or combination thereof. The p-type dopant is Zn, Cd, Be, Mg, Ca or Ba or combination thereof.

Figure 3B:
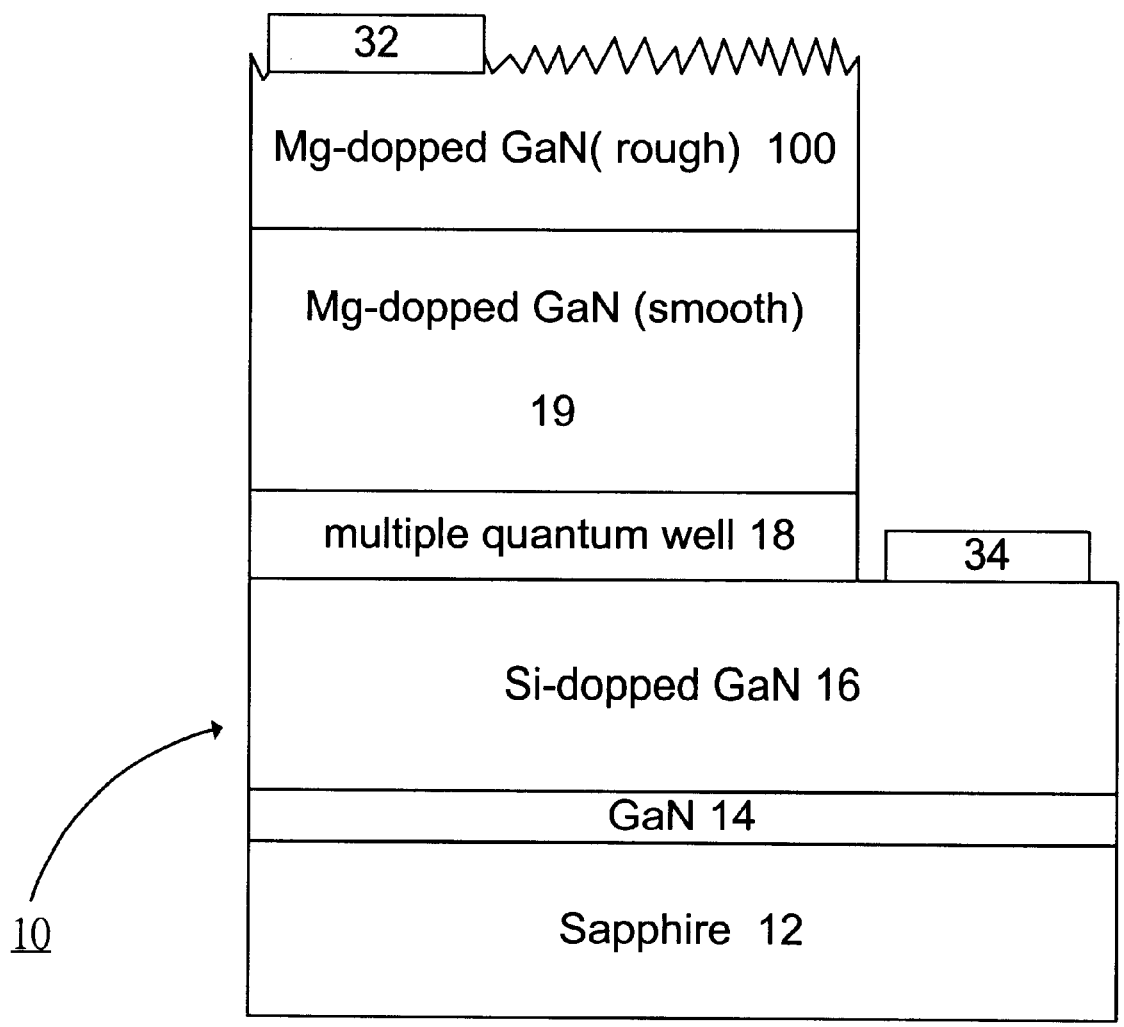

The above light emitting diode epi-wafer 10, after being activated, is further processed to make the chip as shown in FIG. 3(B) according to the following steps.

Step 1: removing a portion of the p-type GaN layers 19, 100 and the quantum well structure 18 to expose a portion of surface of the n-type GaN layer 16.

Step 2: vapor-depositing a Ni/Au ohmic contact metal layer 32 on the surface of the p-type GaN layer 100 and a Ti/Al ohmic contact metal layer 34 on the exposed surface of the n-type GaN layer 16.

Step 3: cutting the vapor-deposited light emitting diode epi-wafer 10 into chips, each one of the chips being a square with a dimension of 350 µm×350 µm.

EXAMPLE 2

Figure 4A:
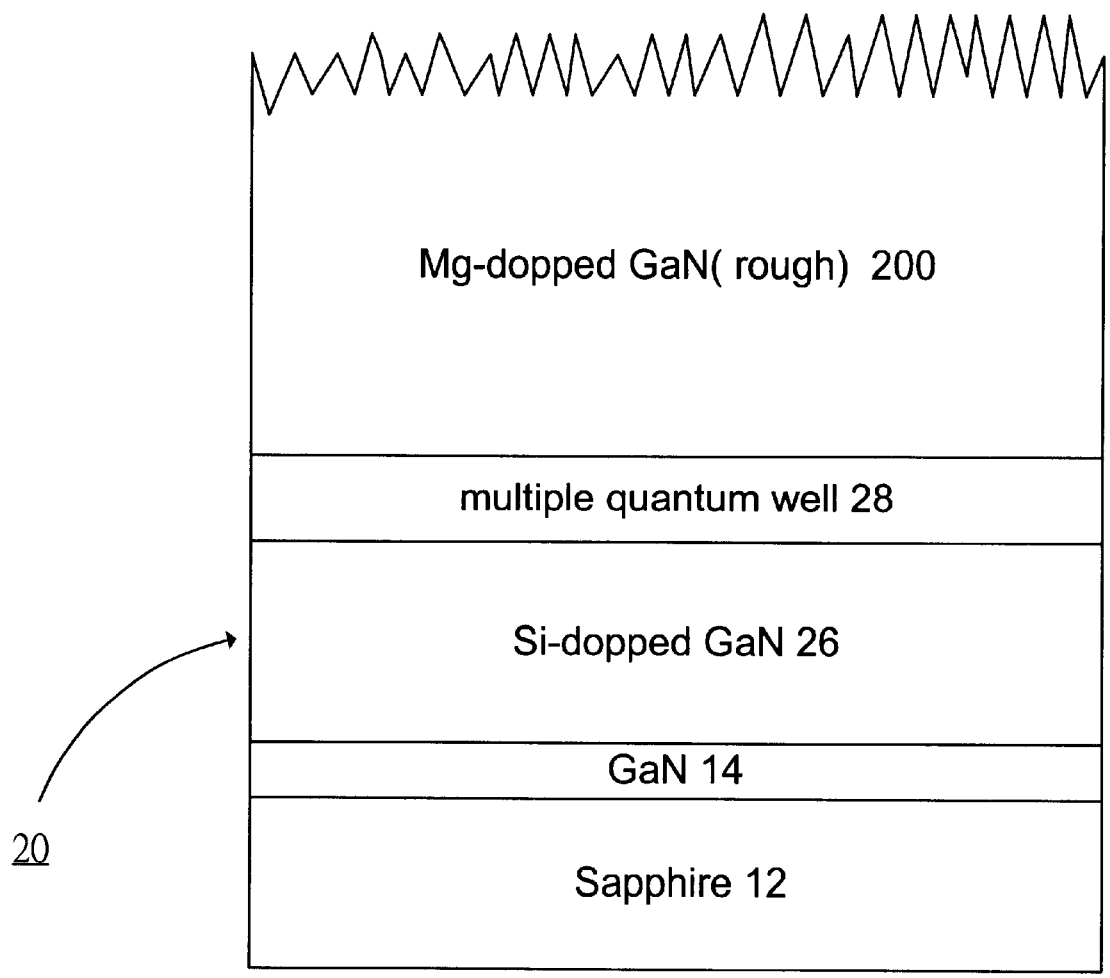
FIGS. 4(A) and 4(B) are schematic diagrams of another light emitting diode of the present invention.

Please refer to FIG. 4(A) that is a schematic diagram of another light emitting diode epi-wafer 20 of the present invention. Firstly, a GaN buffer layer 14 is grown on a sapphire substrate 12 which is then heated to a temperature of about 1130° C. The single crystal substrate 12 is composed of aluminum oxide, silicon carbide or GaAs. A n-type Si-doped GaN layer 26 of a thickness of 4 µm is then grown on the surface of the buffer layer 14. Next, the sapphire substrate 12 is then cooled to about 820° C. and immediately an InGaN/GaN multiple quantum well structure or double-hetero structure 28 is grown on the surface of the n-type Si-doped GaN layer 26. The multiple quantum well or double-hetero structure 28 served as a light emitting active layer. Then, growth parameters are changed to allow the formation of a p-type Mg-doped GaN rough layer 200 on the surface of the InGaN/GaN multiple quantum well structure 28 at a relatively low temperature. The light emitting diode epi-wafer 20 is thus produced. In a preferred embodiment, the p-type rough layer 200 is grown at a growth rate of between 10 Å/min and 1000 Å/min, and V/III ratio thereof is between 1000 and 500000. The n-type dopant is Si, Ge or Tn. The p-type dopant is Zn, Cd, Be, Mg, Ca or Ba.

Figure 4B:
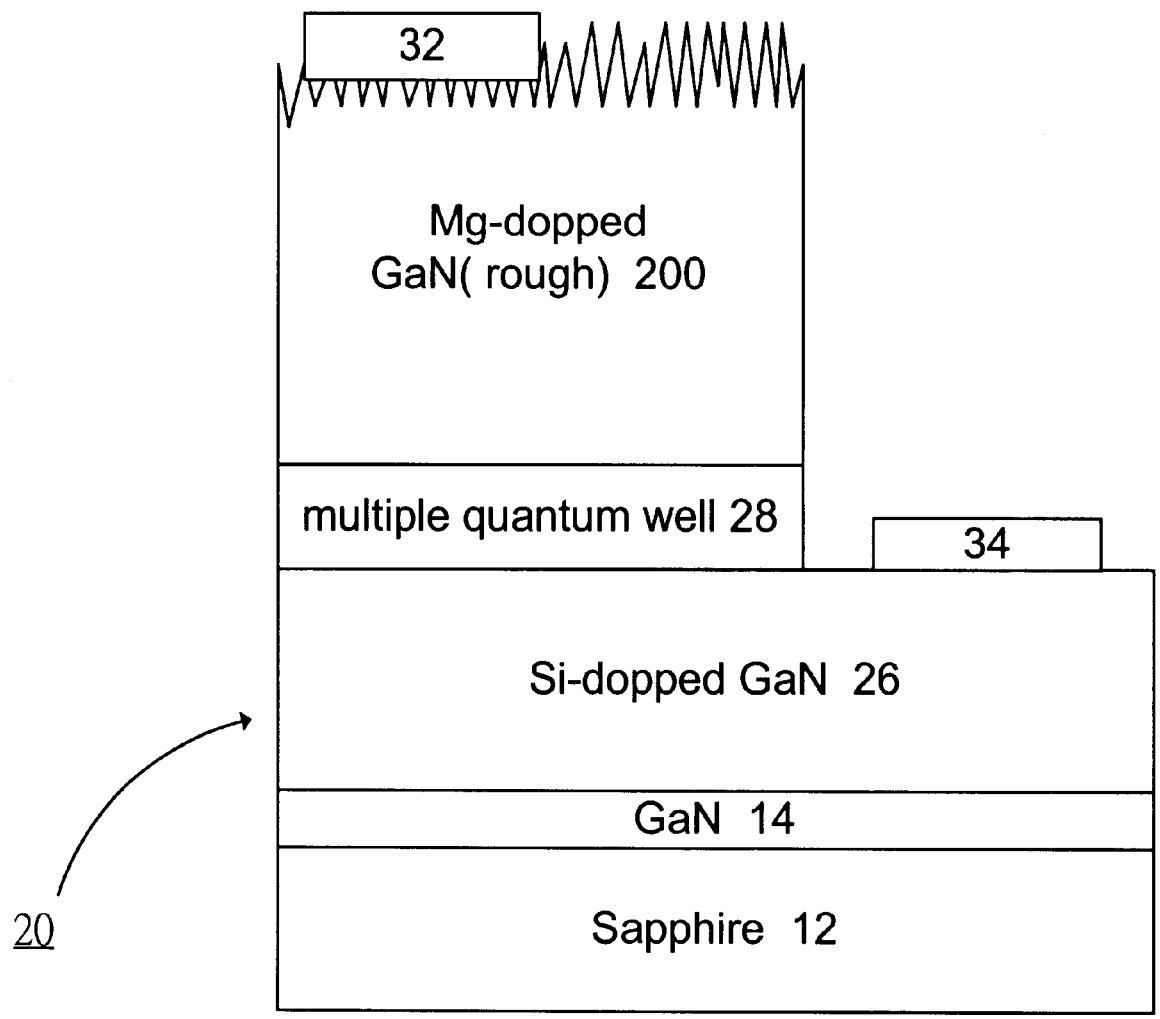

The above light emitting diode epi-wafer 20, after being activated, is further processed to chips as shown in FIG. 4(B) according to the following steps.

Step 1: etching a portion of the p-type GaN layer 200 and the multiple quantum well 28 to expose a surface of a portion of the n-type GaN layer 26.

Step 2: vapor-depositing a Ni/Au ohmic contact metal layer 32 on the surface of the p-type GaN layer 200 and a Ti/Al ohmic contact metal layer 34 on the exposed surface of the n-type GaN layer 26.

Step 3: cutting the vapor-deposited light emitting diode epi-wafer 20 into chips, each one of the chips being a square with a dimension of 350 µm×350 µm.

The forward voltage of the light emitting diode chip 20 according to example 2 is about 3.5 volts, which is close to the forward voltage of a light emitting diode chip without a p-type Mg-doped GaN rough layer 200.

EXAMPLE 3

Figure 5A:
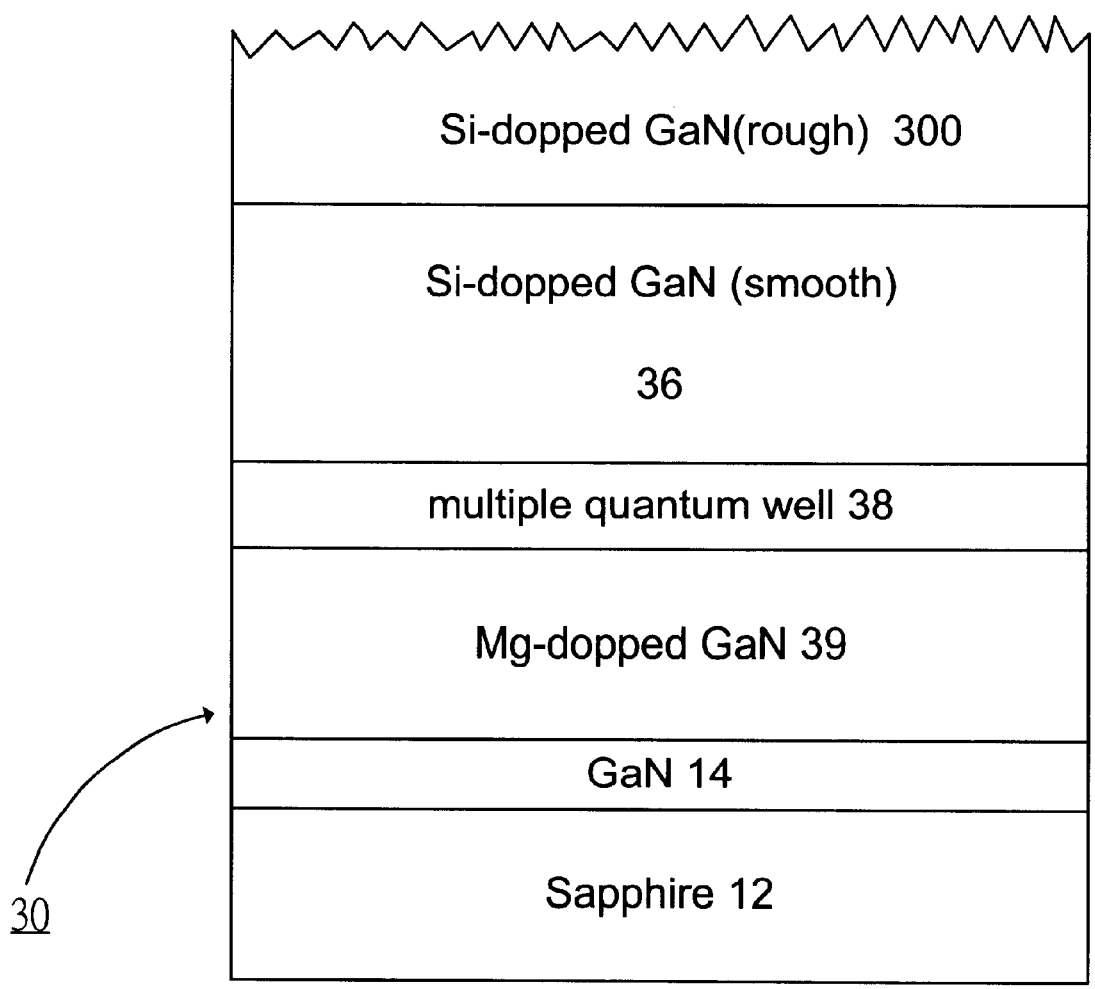
FIGS. 5(A) and 5(B) are schematic diagrams of still another light emitting diode of the present invention.

Please refer to FIG. 5(A) that depicts another light emitting diode epi-wafer 30 of the present invention. Firstly, a GaN buffer layer 14 is grown on a sapphire substrate 12 which is then heated to a temperature of about 1120° C. The single crystal substrate 12 is composed of aluminum oxide, silicon carbide or GaAs. A p-type Mg-doped GaN layer 39 of a thickness of 4 µm is then grown on the surface of the buffer layer 14. Next, an InGaN/GaN multiple quantum well structure or double-hetero structure 38 is grown on the surface of the p-type Mg-doped GaN layer 39. The multiple quantum well or double-hetero structure served as a light emitting active layer. Then, the light emitting diode epi-wafer 30 is heated to 1130° C. An n-type Si-doped GaN layer 36 is grown on the surface of the InGaN/GaN multiple quantum well structure 38. Lastly, the temperature is decreased to below 1000° C. and a GaN rough layer 300 is grown on the surface of the GaN layer 36. The light emitting diode epi-wafer 30 is thus produced. In a preferred embodiment, the rough n-type layer 300 is grown at a growth rate of between 10 Å/min and 1000 Åmin, and V/III ratio thereof is between 1000 and 500000. The n-type dopant is Si, Ge or Tn. The p-type dopant is Zn, Cd, Be, Mg, Ca or Ba.

Figure 5B:
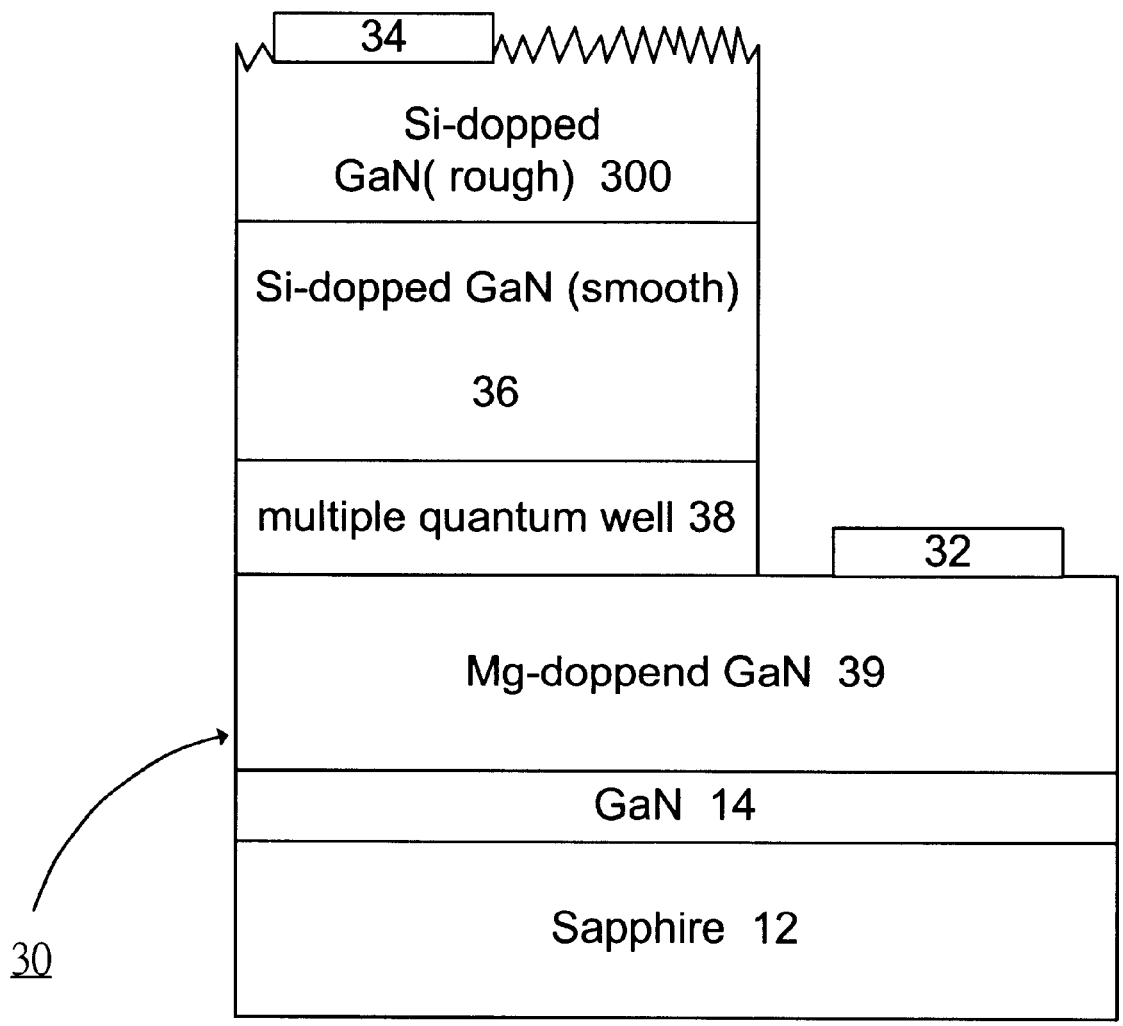

The above light emitting diode epi-wafer 30, after being activated, is further processed to chips as shown in FIG. 5(B) according to the following steps.

Step 1: etching a portion of the n-type GaN layers 36, 300 and the multiple quantum well 38 to expose a surface of a portion of the p-type GaN layer 39.

Step 2: vapor-depositing a Ni/Au ohmic contact metal layer 32 on the exposed surface of the p-type GaN layer 39 and a Ti/Al ohmic contact metal layer 34 on the surface of the n-type GaN layer 300.

Step 3: cutting the vapor-deposited light emitting diode epi-wafer 30 into chips, each one of the chips being a square with a dimension of 350 µg m×350 µm.

EXAMPLE 4

Figure 6A:
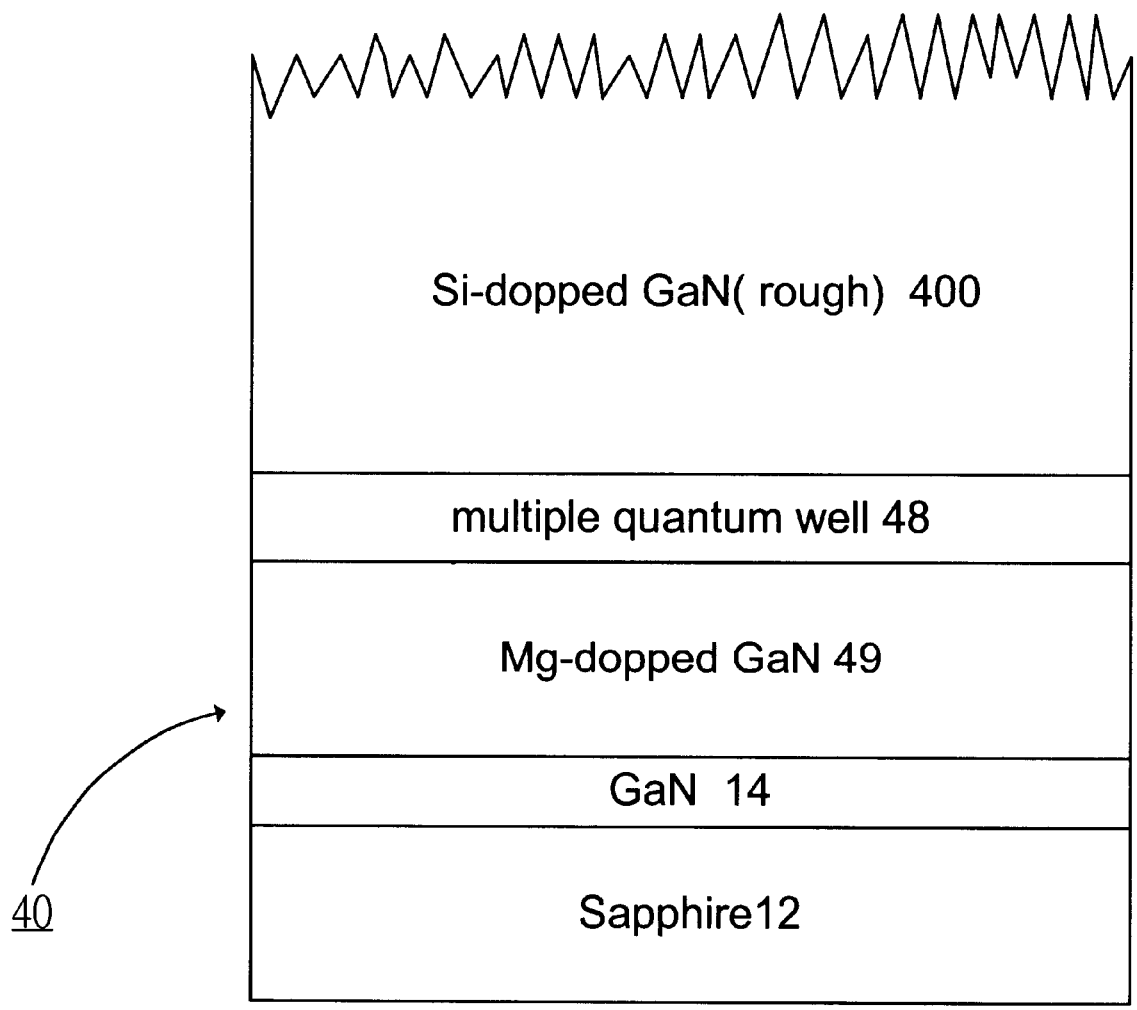
FIGS. 6(A) and 6(B) are schematic diagrams of the other light emitting diode of the present invention.

Please refer to FIG. 6(A) that is a schematic diagram of another light emitting diode epi-wafer 40 of the present invention. Firstly, a GaN buffer layer 14 is grown on a sapphire substrate 12. The single crystal substrate 12 is composed of aluminum oxide, silicon carbide or GaAs. A p-type Mg-doped GaN layer 49 of a thickness of 4 µm is then grown on the surface of the buffer layer 14. Next, the sapphire substrate 12 is then cooled to about 820° C. and an InGaN/GaN multiple quantum well structure or double-hetero structure 48 is grown on the surface of the p-type Mg-doped GaN layer 49. The multiple quantum well or double-hetero structure 48 served as a light emitting active layer. Then, an n-type Si-doped GaN rough layer 400 is grown on the surface of the InGaN/GaN multiple quantum well structure 48. In a preferred embodiment, the n-type rough layer 400 is grown at a growth rate of between 10 Å/min and 1000 Å/min, and V/III ratio thereof is between 1000 and 500000. The n-type dopant is Si, Ge or Tn. The p-type dopant is Zn, Cd, Be, Mg, Ca or Ba.

Figure 6B:
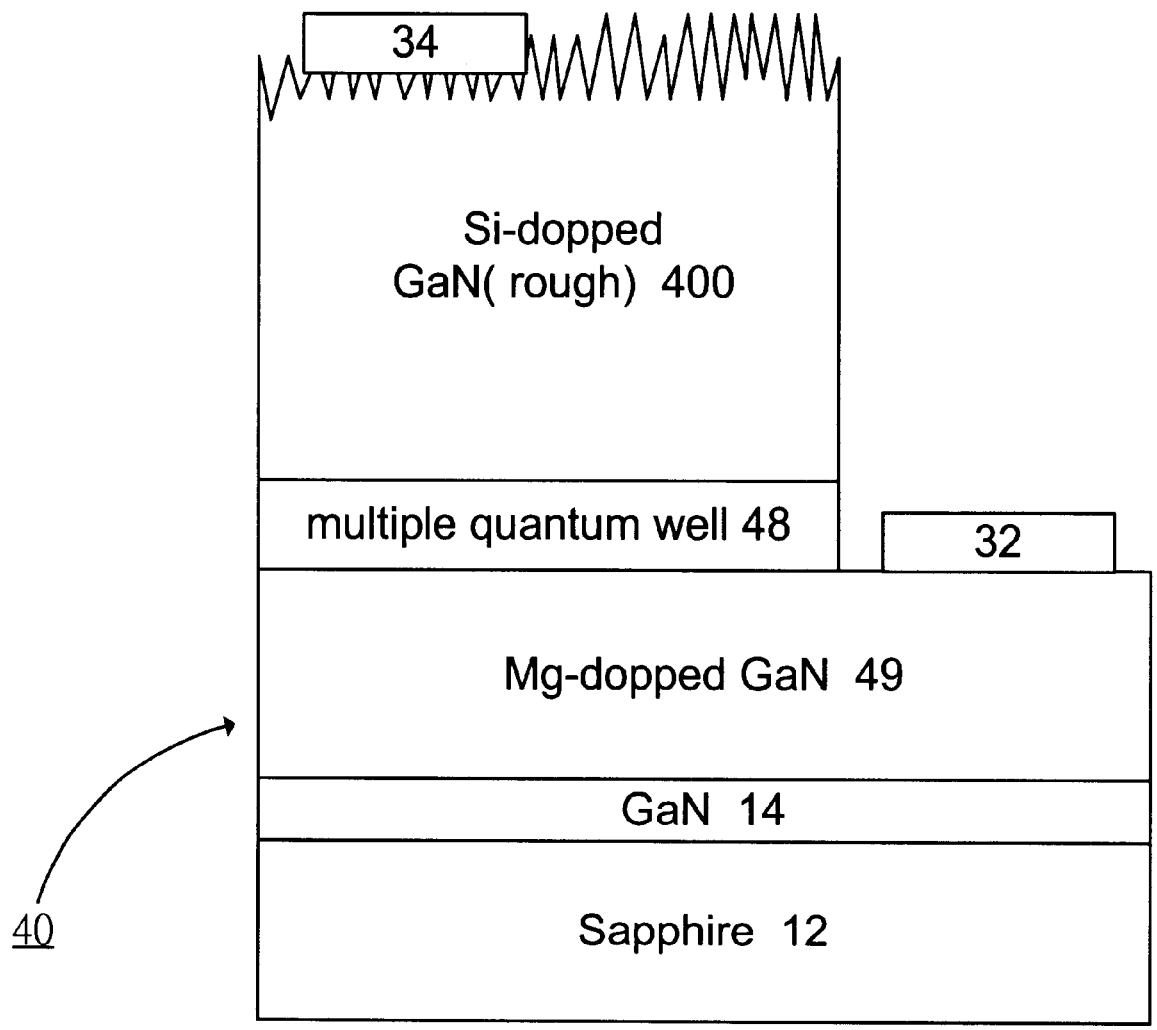

The above light emitting diode epi-wafer 40, after being activated, is further processed to chips as shown in FIG. 6(B) according to the following steps.

Step 1: etching a portion of the n-type GaN layer 400 and the multiple quantum well 48 to expose a surface of a portion of the p-type GaN layer 49.

Step 2: vapor-depositing a Ni/Au ohmic contact metal layer 32 on the exposed surface of the p-type GaN layer 49 and a Ti/Al ohmic contact metal layer 34 on the surface of the n-type GaN layer 400.

Step 3: cutting the metallized light emitting diode 40 into chips, each one of the chips being a square with a dimension of 350 µm×350 µm.

Figure 2:
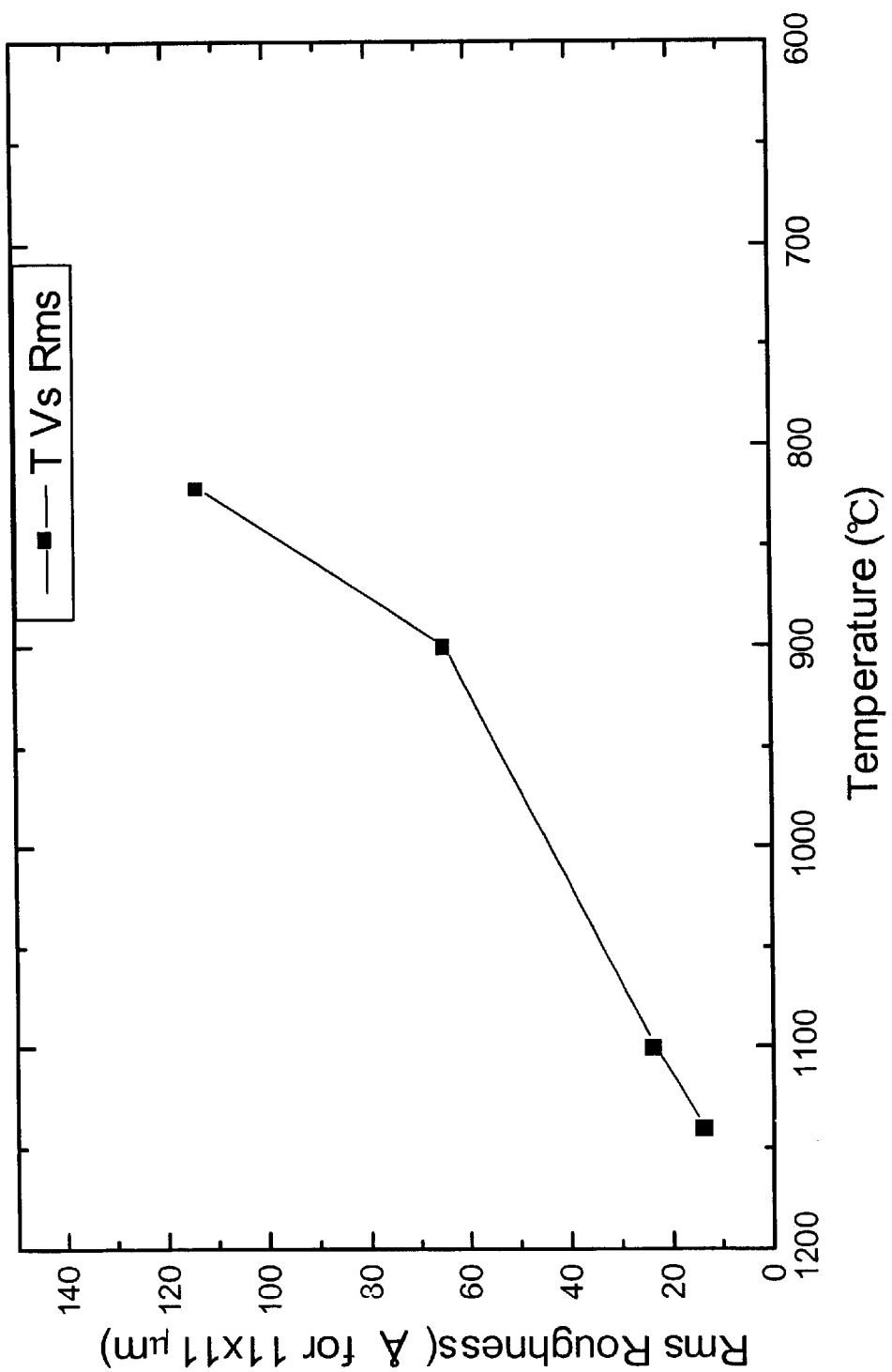
FIG. 2 is a diagram depicting root-mean-square surface roughness vs. growth temperature.

In the method of roughening compound semiconductor surface by varying epitaxy growth parameters, there are so many combinations of the parameters that it is impossible herein to recite each and every combinations. FIG. 2 discloses the relationship between the roughness, which is Rms roughness according to atomic force microscopy (AFM), and the growth temperature under the same V/III ratio and growth parameters.

Comparing to conventional methods, the present invention grows a rough surface on the compound semiconductor material wafers to reduce overall reflection by applying hydride vapor phase epitaxy (HVPE) technique, organometallic vapor phase epitaxy (OMVPE) technique, or molecular beam epitaxy (MBE) technique. External quantum efficiency is thus increased.

The present invention discloses rough surface growth by controlling epitaxial growth parameters. Table 1 is a table of luminance comparisons, wherein run A is a LED chip with smooth surface and run B is a LED chip with rough surface. Luminance of the run A is 28.55 mcd and that of the run B is 35.61 mcd. Apparently luminance of the LED chip with rough surface is significantly increased.

Furthermore, for AlInGaN series light emitting devices which adopt indium compounds in the light emitting active layer, the thermal damage to the light emitting active layer or to the indium thermal diffusion process resulting from a high temperature can be avoided by directly growing a rough covering layer to the active layer at a relatively low temperature. The enhancement effects of the present invention become more significant. Table 2 is a table of luminance comparisons of LED chips with rough surfaces being grown at a high temperature and at a relatively low temperature, wherein the growth temperature of run B is 1100° C. and that of run C is 820° C., and the luminance of the chips is 35.61 mcd and 50.22 mcd respectively. Luminance enhancement is above 40%.

TABLE 1

Luminance comparisons of LED chips with rough surface and smooth surface.

| Run number | Surface Roughness | Luminance (mcd) | Enhancement proportion (%) |
| --- | --- | --- | --- |
| A | NO | 28.55 | 24.7 |
| B | Yes | 35.61 | |

TABLE 2

Luminance comparisons of LED chips with rough surfaces being grown at a high temperature and at a relatively low temperature.

| Run number | Growth Temperature (° C.) | Surface Roughness | Luminance (mcd) | Enhancement proportion (%) |
| --- | --- | --- | --- | --- |
| B | 1100 | Yes | 35.61 | 41.7 |
| C | 820 | Yes | 50.22 | |

The above descriptions are preferred embodiments of the present invention. Equivalent changes and modifications according to the present invention shall be covered by the scope of the present invention.

What is claimed is:

1. A light emitting device of semiconductor, comprising:
   a substrate;
   an $Al_xIn_yGa_{1-x-y}N$ buffer layer which is grown on the substrate, wherein $0 \leq x \leq 1$, $0 \leq y \leq 1$, and $0 \leq x+y \leq 1$;
   a n-type $Al_sIn_tGa_{1-s-t}N$ epitaxial layer which is grown on the buffer layer, wherein $0 \leq s \leq 1$, $0 \leq t \leq 1$, and $0 \leq s+t \leq 1$;
   an InGaN active layer that is grown on the n-type epitaxial layer;
   a p-type $Al_uIn_vGa_{1-u-v}N$ epitaxial layer which is grown on the active layer, wherein $0 \leq u \leq 1$, $0 \leq v \leq 1$, and $0 \leq u+v \leq 1$; and
   a p-type $Al_pIn_qGa_{1-p-q}N$ rough layer which is grown on the p-type epitaxial layer, wherein $0 \leq p \leq 1$, $0 \leq q \leq 1$, and $0 \leq p+q \leq 1$;
   wherein the p-type rough layer is grown at a temperature between 400° C. and 1000° C.

2. The light emitting device of claim 1, wherein the p-type rough layer is grown at a rate between 10 Å/min and 1000 Å/min.

3. The light emitting device of claim 1, wherein a V/III ratio of the p-type rough layer is between 1000 and 500000.

4. The light emitting device of claim 1, wherein the substrate is composed of aluminum oxide, silicon carbide, or GaAs.

5. The light emitting device of claim 1, wherein the n-type epitaxial layer is doped with Si, Ge, or Tn.

6. The light emitting device of claim 1, wherein the InGaN active layer comprises a double-hetero structure or a quantum well structure.

7. A light emitting device of semiconductor, comprising:
   a substrate;
   an $Al_xIn_yGa_{1-x-y}N$ buffer layer which is grown on the substrate, wherein $0 \leq x \leq 1$, $0 \leq y \leq 1$, and $0 \leq x+y \leq 1$;
   a n-type $Al_sIn_tGa_{1-s-t}N$ epitaxial layer which is grown on the buffer layer, wherein $0 \leq s \leq 1$, $0 \leq t \leq 1$, and $0 \leq s+t \leq 1$;
   an InGaN active layer that is grown on the n-type epitaxial layer;

a p-type $Al_u In_v Ga_{1-u-v}N$ rough layer which is grown on the active layer, wherein $0 \leq u \leq 1$, $0 \leq v \leq 1$, and $0 \leq u+v \leq 1$;

wherein the p-type rough layer is grown at a temperature between 400° C. and 10000° C.

8. The light emitting device of claim 7, wherein the p-type rough layer is grown at a rate between 10 Å/min and 1000 Å/min.

9. The light emitting device of claim 7, wherein a V/III ratio of the p-type rough layer is between 1000 and 500000.

10. The light emitting device of claim 7, wherein the substrate is composed of aluminum oxide, silicon carbide, or GaAs.

11. The light emitting device of claim 7, wherein the n-type epitaxial layer is doped with Si, Ge, or Tn.

12. The light emitting device of claim 7, wherein the InGaN active layer comprises a double-hetero structure or a quantum well structure.

13. A light emitting device of semiconductor, comprising:

a substrate;

an $Al_x In_y Ga_{1-x-y}N$ buffer layer which is grown on the substrate, wherein $0 \leq x \leq 1$, $0 \leq y \leq 1$, and $0 \leq x+y \leq 1$;

a p-type $Al_s In_t Ga_{1-s-t}N$ epitaxial layer which is grown on the buffer layer, wherein $0 \leq s \leq 1$, $0 \leq t \leq 1$, and $0 \leq s+t \leq 1$;

an InGaN active layer that is grown on the p-type epitaxial layer;

a n-type $Al_u In_v Ga_{1-u-v}N$ epitaxial layer which is grown on the active layer, wherein $0 \leq u \leq 1$, $0 \leq v \leq 1$, and $0 \leq u+v \leq 1$; and a n-type $A_p In_q Ga_{1-p-q}N$ rough layer which is grown on the n-type epitaxial layer, wherein $0 \leq p \leq 1$, $0 \leq q \leq 1$, and $0 \leq p+q \leq 1$;

wherein the n-type rough layer is grown at a temperature between 400° C. and 1000° C.

14. The light emitting device of claim 13, wherein the n-type rough layer is grown at a rate between 10 Å/min and 1000 Å/min.

15. The light emitting device of claim 13, wherein a V/III ratio of the n-type rough layer is between 1000 and 500000.

16. The light emitting device of claim 13, wherein the substrate is composed of aluminum oxide, silicon carbide, or GaAs.

17. The light emitting device of claim 13, wherein the p-type epitaxial layer is doped with Zn, Cd, Be, Mg, Ca, or Ba.

18. The light emitting device of claim 13, wherein the InGaN active layer comprises a double-hetero structure or a quantum well structure.

19. A light emitting device of semiconductor, comprising:

a substrate;

an $Al_x In_y Ga_{1-x-y}N$ buffer layer which is grown on the substrate, wherein $0 \leq x \leq 1$, $0 \leq y \leq 1$, and $0 \leq x+y \leq 1$;

a p-type $Al_s In_t Ga_{1-s-t}N$ epitaxial layer which is grown on the buffer layer, wherein $0 \leq s \leq 1$, $0 \leq t \leq 1$, and $0 \leq s+t \leq 1$;

an InGaN active layer that is grown on the p-type epitaxial layer;

a n-type $Al_u In_v Ga_{1-u-v}N$ rough layer which is grown on the active layer, wherein $0 \leq u \leq 1$, $0 \leq v \leq 1$, and $0 \leq u+v \leq 1$;

wherein the n-type rough layer is grown at a temperature between 400° C. and 1000° C.

20. The light emitting device of claim 19, wherein the n-type rough layer is grown at a rate between 10 Å/min and 1000 Å/min.

21. The light emitting device of claim 19, wherein a V/III ratio of the n-type rough layer is between 1000 and 500000.

22. The light emitting device of claim 19, wherein the substrate is composed of aluminum oxide, silicon carbide, or GaAs.

23. The light emitting device of claim 19, wherein the p-type epitaxial layer is doped with Zn, Cd, Be, Mg, Ca, or Ba.

24. The light emitting device of claim 19, wherein the InGaN active layer comprises a double-hetero structure or a quantum well structure.

* * * * *